United States Patent
Huber et al.

(10) Patent No.: US 11,226,375 B2
(45) Date of Patent: Jan. 18, 2022

(54) METHOD, APPARATUS AND COMPUTER PROGRAM FOR DETERMINING AN IMPEDANCE OF AN ELECTRICALLY CONDUCTING DEVICE

(71) Applicant: LI.PLUS GMBH, Munich (DE)

(72) Inventors: Christian Huber, Munich (DE); Max Horsche, Augsburg (DE); Martin Brand, Mühldorf a. Inn (DE); Korbinian Schmidt, Munich (DE)

(73) Assignee: LI.PLUS GMBH, Munich (DE)

( * ) Notice: Subject to any disclaimer, the term of this patent is extended or adjusted under 35 U.S.C. 154(b) by 0 days.

(21) Appl. No.: 16/635,520

(22) PCT Filed: Aug. 2, 2018

(86) PCT No.: PCT/EP2018/071084
§ 371 (c)(1),
(2) Date: Jan. 30, 2020

(87) PCT Pub. No.: WO2019/025574
PCT Pub. Date: Feb. 7, 2019

(65) Prior Publication Data
US 2020/0256923 A1    Aug. 13, 2020

(30) Foreign Application Priority Data

Aug. 2, 2017 (EP) .................................. 17184597
Dec. 20, 2017 (EP) .................................. 17209129

(51) Int. Cl.
*G01R 31/389* (2019.01)
*G01R 27/08* (2006.01)
*G01R 27/26* (2006.01)

(52) U.S. Cl.
CPC ........... *G01R 31/389* (2019.01); *G01R 27/08* (2013.01); *G01R 27/2611* (2013.01)

(58) Field of Classification Search
CPC ........ G01R 27/00; G01R 27/02; G01R 27/08; G01R 27/14; G01R 27/16; G01R 27/18;
(Continued)

(56) References Cited

U.S. PATENT DOCUMENTS 6,118,275 A * 9/2000 Yoon .................. G01R 31/3842
324/427
6,167,349 A * 12/2000 Alvarez ............. G01R 31/3648
702/63
(Continued)

FOREIGN PATENT DOCUMENTS

EP    1068540 A2    1/2001
EP    1088240 A1    4/2001
(Continued)

OTHER PUBLICATIONS

Tetsuya Osaka et al: "Proposal of novel equivalent circuit for electrochemical impedance analysis of commercially available lithium ion batter", Journal of Power Souices, Elsevier SA, CH, vol. 205, Jan. 10, 2012.
(Continued)

Primary Examiner — Hoai-An D. Nguyen
(74) Attorney, Agent, or Firm — Maschoff Brennan

(57) ABSTRACT

A method for determining an impedance of an electrically conducting device, such as a battery or a welded metal joint, includes applying a time-varying electric current to the electrically conducting device. The current varies at least between a first level and a second level. The current changes between the first level and second level within a time interval that is so short that a voltage response of the electrically conducting device exhibits a first local voltage extremum followed by a decay. An ohmic resistance voltage is adopted by the voltage response, when the first local voltage extremum has decayed. The method further includes acquiring the voltage response at least partially and deter-
(Continued)

Figure 1:
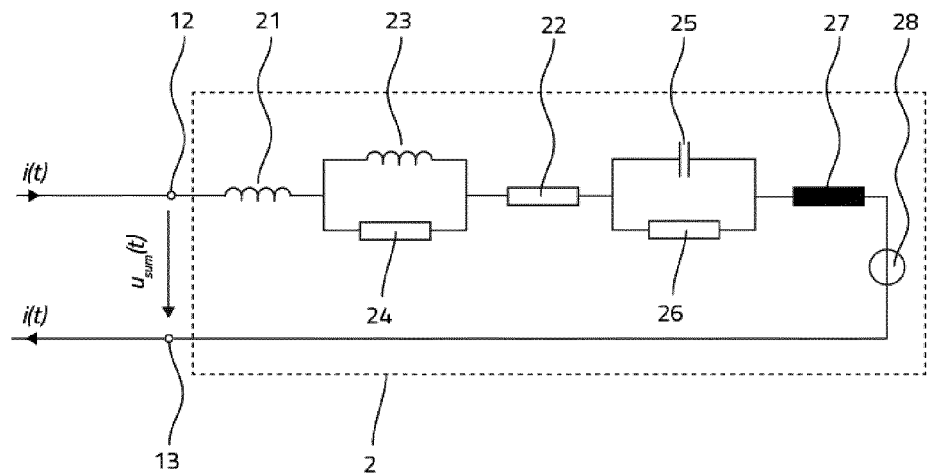

mining an impedance of the electrically conducting device from the acquired voltage response.

21 Claims, 3 Drawing Sheets

(58) Field of Classification Search
CPC ...... G01R 27/20; G01R 27/205; G01R 27/22; G01R 27/26; G01R 27/2611; G01R 31/00; G01R 31/36; G01R 31/389
USPC ....... 324/421, 425, 426, 430, 500, 512, 525, 324/600, 649, 691, 713; 361/1, 88, 91.1, 361/91.2, 93.1, 93.5, 93.7
See application file for complete search history.

(56) References Cited

U.S. PATENT DOCUMENTS 7,212,006 B2* 5/2007 Huang ................. G01R 31/389
324/430

2003/0206021 A1* 11/2003 Laletin ................. G01R 31/386
324/426
2004/0056643 A1* 3/2004 Loef ..................... G01R 31/386
323/288

FOREIGN PATENT DOCUMENTS

| EP | 1548452 | A2 | 6/2005 |
| EP | 1634088 | A2 | 3/2006 |

OTHER PUBLICATIONS

S. Buller et al: "Impedance-Based Simulation Models of Supercapcitors and Li-Ion Batteries for Power Electronic Applications", IEEE Transactions on Industry Applications., vol. 41, No. 3, May 2, 2005.

Alavis S M M et al: "Time-domain fitting of batter electrochemical impedance models", Journal of Power Sources, vol. 288, Apr. 28, 2015.

* cited by examiner

METHOD, APPARATUS AND COMPUTER PROGRAM FOR DETERMINING AN IMPEDANCE OF AN ELECTRICALLY CONDUCTING DEVICE

The invention relates to a method for determining an impedance of an electrically conducting device according to claim 1, a computer program according to claim 14, and an apparatus for executing the method according to claim 15.

From research to recycling, the impedances of batteries need to be analyzed repeatedly to check the functionality, power capability, state of safety and residual value. However, the need for a precise determination of impedances is not only given for batteries but for many other technical components and subcomponents, such as welded connections, as well. Four methods for determining an impedance of an electrically conducting device are known:

Direct Current (DC) Resistance

When executing this method, a constant current is applied to the terminals of the electrically conducting device under test and the corresponding voltage response at the terminals is measured. The desired DC resistance is determined at a defined time, usually ten seconds, after the constant current is applied. The change in the terminal voltage from its initial value to the value at the defined instant of time is divided by the applied current to calculate the DC resistance.

When batteries are analyzed using this method, it remains unclear how to interpret a DC resistance value and what information the value contains. Furthermore, the DC resistance depends on many factors and consequently its reproducibility is poor.

Current Pulse Method

The principle of this method is similar to the procedure for determining a DC resistance. The difference is that the current pulse method uses not only one instant of time but the whole constant current phase and the corresponding response of the terminal voltage to analyze the impedances of the electrically conducting device. An equivalent electric circuit (EEC) model usually is fitted to obtain more detailed impedance values.

Although more detailed information on the impedances can be gained, results are not mathematically unique and the problems inherent to the DC method exist for the current pulse method as well. Furthermore, both methods, the current pulse method and the measurement of the DC resistance, do not account for the fast-dynamic impedances, such as inductances, since sample rates of apparatus that are state of the art are too low.

Electrical Impedance Spectroscopy (EIS)

This method works in the frequency domain. Thereby an alternating signal, usually a sine current, is induced to the electrically conducting device and the device responds with an alternating terminal signal, usually the terminal voltage. A complex impedance is calculated for every applied frequency and the results can be depicted in a Nyquist or Bode plot.

The whole measurement takes at least several seconds and works only as long as the electrically conducting device behaves like a linear time-invariant (LTI) system. The interpretation of the results is not clearly defined and depends mainly on the skills of the operator.

Alternating Current (AC) Resistance:

In principle, the AC resistance method is an EIS conducted at one single frequency, usually 1 kHz. The AC resistance value is only the real part of the ascertained complex impedance.

The informative value is very low, since the interpretation remains undefined and many dependencies exist. Nevertheless, in contrast to the EIS, the AC-method is easily operable and faster compared to the other analyzing methods presented above.

The majority of methods for determining impedances of an electrically conducting device operate according to the above laid out principles. For example, EP 1634088 A2, EP 1068540 A1 and EP 1548452 A1 disclose methods for measuring the battery capacity by using sequences of current pulses and analyzing a voltage response of the battery.

While in EP 1634088 A2 an inductive overshoot in the voltage response is observed, none of the methods controls and uses said inductive overshoot to distinguish and analyze the ohmic from the inductive parameters characterizing the battery. On the contrary, the inductive overshoot is seen as a measurement outlier or error, which has to be omitted if possible.

The problem according to the invention is to provide a method that overcomes the above-mentioned problems at least partially.

This object is achieved by the method having the features of claim 1.

Advantageous embodiments are described in the subclaims.

According to claim 1 a method for determining an impedance of an electrically conducting device, such as a battery or a welded metal joint, comprises the steps of:

particularly electrically connect the terminals of the electrically conducting device with a particularly controllable electric current supply, applying a time-varying electric current through the electric terminals of the electrically conducting device, wherein the electric current varies at least between a first level and a second level, wherein the current changes between the first and second level within a time interval, wherein said time interval is so short that a voltage response to the applied current changes of the electrically conducting device at the terminals exhibits a first local voltage extremum, such as a peak, particularly at the time point, at which the applied current reaches the second level, particularly due to an inductive overshoot, followed by a decay, wherein an ohmic resistance voltage, i.e. a voltage mainly caused by ohmic resistances is adopted by the voltage response, when the first local voltage extremum has decayed, particularly wherein the ohmic resistance voltage is adopted after the first local voltage extremum within 0.5 milliseconds, more particularly within 100 microseconds, more particularly within 10 microseconds, even more particularly within 5 microseconds, particularly while the applied current is still at the second level, acquiring, particularly recording, the voltage response at least partially, particularly comprising and resolving the first local voltage extremum and the ohmic resistance voltage, determining an impedance of the electrically conducting device from the acquired voltage response, particularly from the ohmic resistance voltage and the applied current.

In contrast to techniques that are state of the art, the method according to the invention allows to analyze, particularly in the time domain, not only the slow dynamic impedances of the electrically conducting device but also the fast-dynamic impedances. Particularly electro-physical processes contribute to these fast-dynamic impedances with predominantly ohmic and inductive characteristics.

The electrically conducting device comprises particularly an ohmic resistance, and particularly exhibits a voltage response characteristic that exhibits an inductive overshoot and its decay after the inductive overshoot peak. Once the overshoot has decayed the ohmic resistance voltage can be determined and thus the ohmic resistance can be determined from the electrically conducting device.

This is particularly useful, when slower dynamics of the voltage response occur at longer times concealing the ohmic resistance voltage by other voltage response components, such as slow RC or RL components.

An RC component is particularly an electric circuit that comprises an ohmic resistance (R) and a capacitive component (C), such as a capacitor that are connected in a parallel circuit.

Analogously, an RL component is particularly an electric circuit that comprises an ohmic resistance (R) and an inductive component (L) that are connected in a parallel circuit.

It is noted that the ohmic resistance voltage is a voltage mainly cause by an ohmic resistance of the electrically conducting device. However, as other electric components of the device, such as an inductance, an RC component or an RL component might still exhibit or might start to exhibit a voltage response to the applied current, the ohmic resistance voltage can comprise some contribution from such other electric components. The ohmic resistance voltage particularly consists of at least 50% caused by an ohmic resistance.

The method particularly requires the determination of the first local voltage extremum and the subsequent decay in order to identify the ohmic resistance voltage of the impedance of the electrically conducting device.

The subsequent decay is particularly in the order of microseconds, particularly one microsecond. Particularly, the decay can be modelled as an exponential decay, with a decay time of less than one microsecond. The first local extremum is particularly considered to be decayed, when the inductive overshoot of the voltage falls below 25%, more particularly below 10% of its initial magnitude.

The terminals of the electrically conducting device are for example the electric poles of a battery or two measurement points of a welded metal joint.

The current supply is configured to provide the necessary current to the electrically conducting device. Therefore, the current supply is capable of providing a time-varying current that changes so fast and so accurately from the first level to the second level that the required voltage response can be evoked by the electrically conducting device.

One reason, why the inductive overshoot, i.e. the first local voltage extremum has remained unused so far, is the high complexity to generate a current or current pulse that is perfectly controlled in the highly dynamic range of microseconds or even fractions of microseconds.

The current supply can be comprised in a device or controlled by a device that simultaneously monitors and records the applied current.

The applied current can be recorded synchronously with the acquired voltage response. However, the applied current does not need to be measured at al, as it is provided by a device configured to provide the particularly fast and accurate current changes from the first level to the second level. Therefore, applied the current is known by design.

The first level and the second current level differ in their amperage. The first current level and the second current level are particularly end points of a current ramp that is applied to the electrically conducting device, i.e. the applied current particularly does only change within the time interval and remains constant before and thereafter.

The ramp can be linear.

The time interval between the first and second level is particularly shorter than the time intervals used in the state of the art, at least in so far that the time resolution that is used for acquiring the voltage response is better than the time resolution from the state of the art methods.

Therefore, the voltage response is recorded with a higher time resolution as compared to the state of the art. This feature allows in the first place analyzing the first local extrema of the voltage response and the ohmic resistance voltage. These features of the voltage response are disregarded by the methods of the state of the art, when determining an ohmic resistance or an impedance of an electrically conducting device such as a battery.

As the dynamic of the voltage response can be different for different devices, the time interval and the current levels are particularly adjustable or adjusted to the respective electrically conducting device.

The time interval and current levels can also be determined from a series of such measurements, wherein each measurement is performed with a different time interval and/or current levels until eventually the characteristic features of the voltage response are detected by the method according to the invention.

The first local voltage extremum is particularly shaped as a peak that is sufficiently prominent to be distinguished from measurement noise or transient oscillation of the controller of the current supply (which exhibits a plurality of small extrema) so that the peak can be identified in the voltage response.

The acquisition of the voltage response is particularly facilitated by a measurement comprising a recording and particularly a storing of the voltage response.

For the determination of the impedance of the electrically conducting device from the acquired voltage response and the applied current, it is particularly possible to apply different approaches. One approach can be the fitting of a model function to the acquired voltage response, while another approach can rely on the determination of certain features of the voltage response.

The voltage response of the electrically conducting device is the exhibited voltage of the electrically conducting device, particularly during and after the current is applied to the electrically conducting device.

The applied current has to change so rapidly between the first and second level that particularly an overshoot of the voltage response due to at least one inductive element of the electrically conducting device is visible, particularly as a first local extremum.

Whether the first local extremum is a maximum or minimum depends on the sign of the voltage response. If the voltage response comprises mainly positive voltages, then the first local extremum is a maximum. Otherwise, the first local extremum is a minimum.

According to the invention by acquiring the first local extremum in the voltage response, inductive and ohmic impedances can be determined, based on the characteristic peak of the first local extremum and particularly from the ohmic resistance voltage.

According to another embodiment of the invention, the first local voltage extremum is followed by a second opposite local voltage extremum that can also be a voltage plateau, wherein the ohmic resistance voltage is the voltage at the second opposite local voltage extremum or at the plateau, particularly wherein the second opposite local voltage extremum is spaced apart closer than 0.5 milliseconds, particularly closer than 100 microseconds, more particularly closer than 10 microseconds, particularly closer than 5 microseconds from the first local extremum.

The second opposite local voltage extremum is particularly the voltage of the voltage response caused by a decay of the inductive response and the onset of a voltage response of a capacitive element, such as an RC element of the electrically conducting device.

In case the first local extremum is a local maximum, the second opposite local extremum is a local minimum or a plateau, while, if the first local extremum is a local minimum, the second opposite local extremum is a local maximum or a plateau.

According to another embodiment of the invention, the time interval within which the current changes from the first current level to the second current level is less than 0.5 milliseconds, particularly less than 0.1 milliseconds, more particularly less than 50 microseconds, even more particularly less than 10 microseconds, particularly 5 microseconds.

When the current is changing within the above disclosed time intervals the likelihood that the first and particularly the second local voltage extrema become observable is increased. If the time interval is much slower than the above disclosed times, then the method according to the invention is particularly not executable as particularly the second voltage extremum of the voltage response is not showing or other voltage contributions are superimposed and thus the voltage response cannot be used for determination of the impedance.

The acquisition of the voltage response, therefore, has to have a high enough temporal resolution, such that the first and/or at least the second extremum can be resolved.

According to another embodiment of the invention, the electrically conducting device is a battery, a battery pack, a battery bank, or system of batteries.

The term "battery" refers to a chemical storage device for electric energy. The term "battery" furthermore comprises non-rechargeable as well as rechargeable batteries, such as lithium-ion accumulators, nickel-cadmium batteries, lithium-polymer batteries, as well as lead-based accumulators.

The method according to the invention is particularly suited for analyzing the welding/electric connections inside of a battery pack or battery bank.

According to another embodiment of the invention, the electrically conducting device's voltage response can be modelled as an equivalent electric circuit (EEC) comprising at least one inductive element, such as an inductance, at least one ohmic resistance element, an RC element and an RL element, wherein the elements are particularly connected in series. All these elements exhibit particularly a different voltage response characteristic, such that by a rapid change of applied current, the contributions to the voltage response of each element can be resolved.

According to another embodiment of the invention, an ohmic resistance $R_\Omega$ of the impedance of the device is determined, wherein the ohmic resistance is particularly determined from $R_\Omega = |(U_{sum,min} - U_{sum,0})/(I_2 - I_0)|$, wherein $I_0$ is the first current level, $I_2$ is the second current level, $U_{sum,min}$ is the ohmic resistance voltage of the voltage response and $U_{sum,0}$ is the voltage of the voltage response, when the current is at the first level.

The ohmic resistance of the device can be determined from the ohmic resistance voltage, particularly from the second local extremum. Even though the device might exhibit a plurality of elements contributing to its impedance, the method according to the invention is capable to determine the ohmic resistance only, particularly due to its rapid change of applied current.

According to another embodiment of the invention, the voltage response comprises an inductive voltage response $U_{sum,1}$ wherein the inductive voltage response $U_{sum,1}$ is determined from the voltage response that is acquired at the instant the current starts changing from the first level to the second level, wherein the inductive voltage response $U_{sum,1}$ is particularly an initial voltage step exhibited by the voltage response at said instant.

The instant the current starts changing from the first level is particularly shorter than 1 microsecond, more particularly shorter than 0.5 microseconds measured from the start of the change of the current.

According to another embodiment of the invention, the applied current changes from the first level with a constant rate di/dt, wherein the rate is particularly greater than 1 kA/s, more particularly 300 kA/s.

Applying a constant rate is particularly useful for predicting the shape of the voltage response, particularly when an EEC model is assumed for the device.

According to another embodiment of the invention, an external inductance of the electrically conducting device is determined from $L_e = |(U_{sum,1} - U_{sum,0}) \cdot dt/di|$, wherein $U_{sum,1}$ is the inductive voltage response, and $L_e$ is an external inductance of the device.

Therefore, the method according to the invention is also capable to determine an inductive part of the impedance. This is particularly useful when devices are tested that do not comprise a capacitive impedance. For example, the quality/conducting properties of welded metal joints can be determined by this embodiment, as welded metal joints do exhibit almost solely inductances and an ohmic resistance and almost no capacitances.

The external impedance can be determined also for batteries according to this embodiment.

According to another embodiment of the invention, the first current level is higher than the second current level.

In this embodiment, the change has a negative rate. The applied current is particularly also negative.

In an alternative embodiment of the invention, the first current level is lower than the second level.

In this embodiment, the rate of change is positive. The applied current is particularly positive.

According to another embodiment of the invention, the applied current is changing from a temporally constant first level to a temporally constant second level.

This embodiment allows for unambiguously assigning the voltage response to the change between the first and second level.

Furthermore, this embodiment allows the additional determination of a DC resistance.

According to another embodiment of the invention, the first level or the second level is 0 Ampere and particularly wherein the modulus of the other level, the second or the first, is greater than 0.01 Ampere.

This embodiment also allows for the unambiguous assignment of the voltage response to the change of applied current. Indeed, the current is only applied, when the change from the first level is initiated.

According to another embodiment of the invention, the applied current alternates repeatedly between the first level and the second level and particularly wherein the applied current changes between the first level and the second level within different time intervals and/or at variable rates.

According to this embodiment, the current particularly remains on the second and first level for so long that the voltage response has exhibited the first and particularly the second extremum. By repeatedly alternating between the first and second level a plurality of impedance determinations can be obtained within a short time. An average impedance can be determined accounting for statistical variations of the single measurement.

According to another embodiment of the invention, the applied current changes between the first level and a plurality of current levels, particularly repeatedly.

According to this embodiment, it is possible to determine a plurality of measurements for a single device, wherein for each measurement the impedance can be determined. From the determined impedances, average impedance can be calculated and a more accurate determination of the impedance can be given.

According to another embodiment of the invention, the impedance of the electrically conducting device is determined by a model-function that is fitted to the acquired voltage response, wherein the model-function comprises a term that accounts for a voltage response caused by at least one inductive element, such as an inductance, and a term accounting for at least one ohmic resistance element, particularly wherein the model-function is configured to model an EEC.

This embodiment allows for an alternative or additional way of how to determine the impedance. The model function particularly accounts for the physical properties of the device under test, particularly based on an EEC associated to the device under test.

According to another embodiment of the invention, the model function comprises fit parameters, wherein from the fitted model function, the fit parameters are determined and from the fit parameters at least the ohmic resistance, particularly the impedance of the electrically conducting device is determined.

The fit parameters can be directly related to the impedance.

According to another embodiment of the invention, a continuous current, particularly a charging current, or an alternating current pattern is applied to the electrically conducting device, additionally to the first and second level.

This embodiment allows for a test of the device, while it is simultaneously charged, monitored, or operated.

The problem according to the invention is furthermore solved by a computer program for determining an impedance of an electrically conducting device, such as a battery or a welded metal joint, comprising computer program code, wherein, when the computer program is executed on a computer, the method according to the invention is executed.

The term 'computer', or system thereof, is used herein as ordinary context of the art, such as a general-purpose processor or a micro-processor, RISC processor, or DSP, possibly comprising additional elements such as memory or communication ports. Optionally or additionally, the terms 'processor' or 'computer' or derivatives thereof denote an apparatus that is capable of carrying out a provided or an incorporated program and/or is capable of controlling and/or accessing data storage apparatus and/or other apparatus such as input and output ports. The terms 'processor' or 'computer' denote also a plurality of processors or computers connected, and/or linked and/or otherwise communicating, possibly sharing one or more other resources such as a memory.

As used herein, the terms 'server' or 'client' or 'backend' denotes a computerized device providing data and/or operational service or services to one or more other computerized devices or computers.

The terms 'software', 'computer program', 'software procedure' or 'procedure' or 'software code' or 'code' or 'application' or 'app' may be used interchangeably according to the context thereof, and denote one or more instructions or directives or circuitry for performing a sequence of operations that generally represent an algorithm and/or other process or method. The program is stored in or on a medium such as RAM, ROM, or disk, or embedded in a circuitry accessible and executable by an apparatus such as a processor or other circuitry.

The processor and program may constitute the same apparatus, at least partially, such as an array of electronic gates, such as FPGA or ASIC, designed to perform a programmed sequence of operations, optionally comprising or linked to a processor or other circuitry.

As used herein, without limiting, a module represents a part of a system, such as a part of a program operating or interacting with one or more other parts on the same unit or on a different unit, or an electronic component or assembly for interacting with one or more other components.

As used herein, without limiting, a process represents a collection of operations for achieving a certain objective or an outcome.

The term 'configuring' and/or 'adapting' for an objective, or a variation thereof, implies using at least a software and/or electronic circuit and/or auxiliary apparatus designed and/or implemented and/or operable or operative to achieve the objective.

A device storing and/or comprising a program and/or data constitutes an article of manufacture. Unless otherwise specified, the program and/or data are stored in or on a non-transitory medium.

In the context of embodiments of the present disclosure, by way of example and without limiting, terms such as 'operating' or 'executing' imply also capabilities, such as 'operable' or 'executable', respectively.

The problem according to the invention is furthermore solved by an apparatus for determining an impedance of an electrically conducting device particularly by executing the method according to the invention, wherein the apparatus comprises a current supply and wherein the apparatus is configured to acquire the voltage response with a temporal resolution that is sufficiently high to determine the first local voltage extremum and particularly the second local opposite voltage extremum of the voltage response and particularly wherein the apparatus is configured to apply a current change within the time interval.

The temporal resolution of the apparatus should be better than 0.1 milliseconds, more particularly less than 50 microseconds, even more particularly less than 10 microseconds, particularly 5 microseconds, in order to be capable of recording the first and second extrema of the voltage response.

According to another embodiment of the invention, the apparatus has a temporal resolution for recording the voltage response of at least 10 microseconds, particularly of at least 1 microsecond.

According to another embodiment of the invention, the apparatus has means for contacting the electrically conducting device.

Further features and advantages of the invention shall be described by means of a detailed description of exemplary, non-limiting embodiments, wherein all the embodiments disclosed in the examples section can also be used in combination with the claimed subject matter.

The method can determine the impedance of the electrically conducting device (also referred to as device under test), in five steps:

a. A defined current pulse (also referred to as applied current), which changes its value from a lower, first level $I_0$ to a higher second level $I_2$, is applied to the terminals of the device under test. The current change within the pulse is quick, preferably with a rise time between several microseconds and fractions of a millisecond. In any case, the current change is quick enough to cause a defined inductive overshoot of the terminal voltage of the device under test that decays before other possible impedances with slower time constants significantly contribute to the terminal voltage. The ohmic resistance voltage, which occurs after the inductive overshoot (first local voltage extremum) largely decayed, is referred to as $U_{sum,min}$. Depending on the elements of the impedance of the electrically conducting device, $U_{sum,min}$ corresponds to the voltage at the second local opposite voltage extremum.

b. The sampling rate of the voltage response measurement is high enough to detect the local extremum in the terminal voltage $U_{sum,min}$.

c. An uniquely defined impedance, called the ohmic resistance $R_\Omega$ henceforth, is calculated using the change in the terminal voltage, which is given by subtracting the initial value $U_{sum,0}$, measured at the current $I_0$, from the value at the second local extremum $U_{sum,min}$. The ohmic resistance $R_\Omega$ is calculated by dividing the voltage difference $U_{sum,min} - U_{sum,0}$ by the current change $I_2 - I_0$.

d. Optionally the current pulse from $I_0$ to $I_2$ changes the current with a linear ramp and therefore exhibits a constant current change rate di/dt. The sampling rate is fast enough to detect the initial step in the terminal voltage from $U_{sum,0}$ to $U_{sum,1}$, which is caused by the external inductance $L_e$ of the device under test.

e. The external inductance $L_e$ can be calculated by dividing the occurring step in the terminal voltage $U_{sum,1} - U_{sum,0}$ by the constant current change rate di/dt.

The method according to the invention and also the device according to the invention are configured and designed for the analytical evaluation of the impedances of a device under test, the reproducible and mathematical unique results, as well as for the high informational content of the results. Above all, the invention provides substantial benefit for testing batteries and for the determination of their power capability, general functionality, state of safety, etc. Further benefits and advantages of the invention will be described by means of a detailed figure description and exemplary embodiments with reference to the accompanying drawings.

It is shown in

Figure 2:
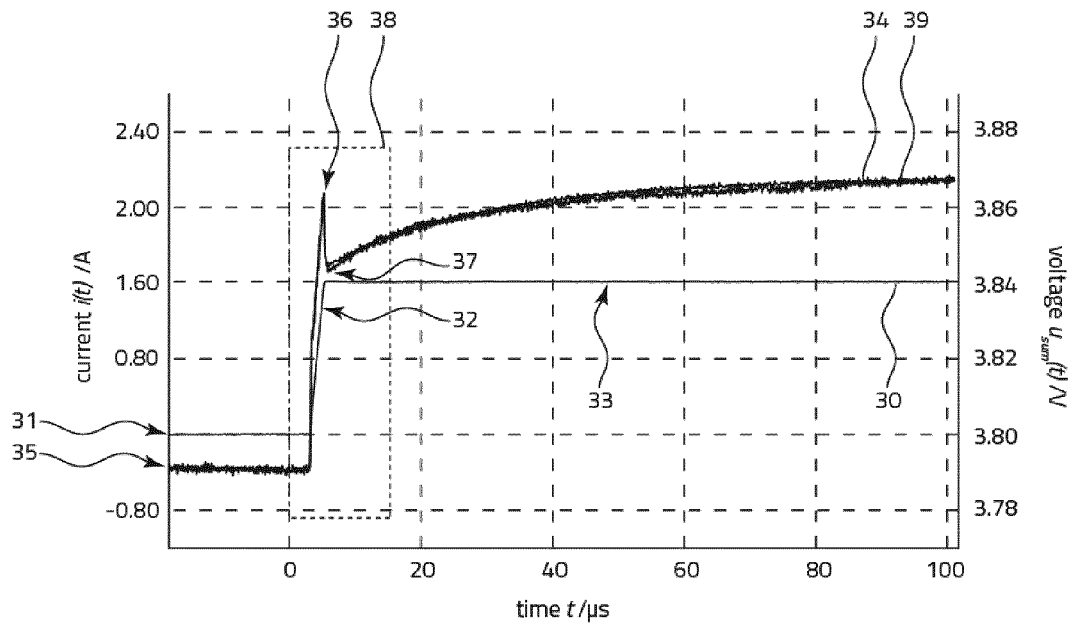
Figure 3:
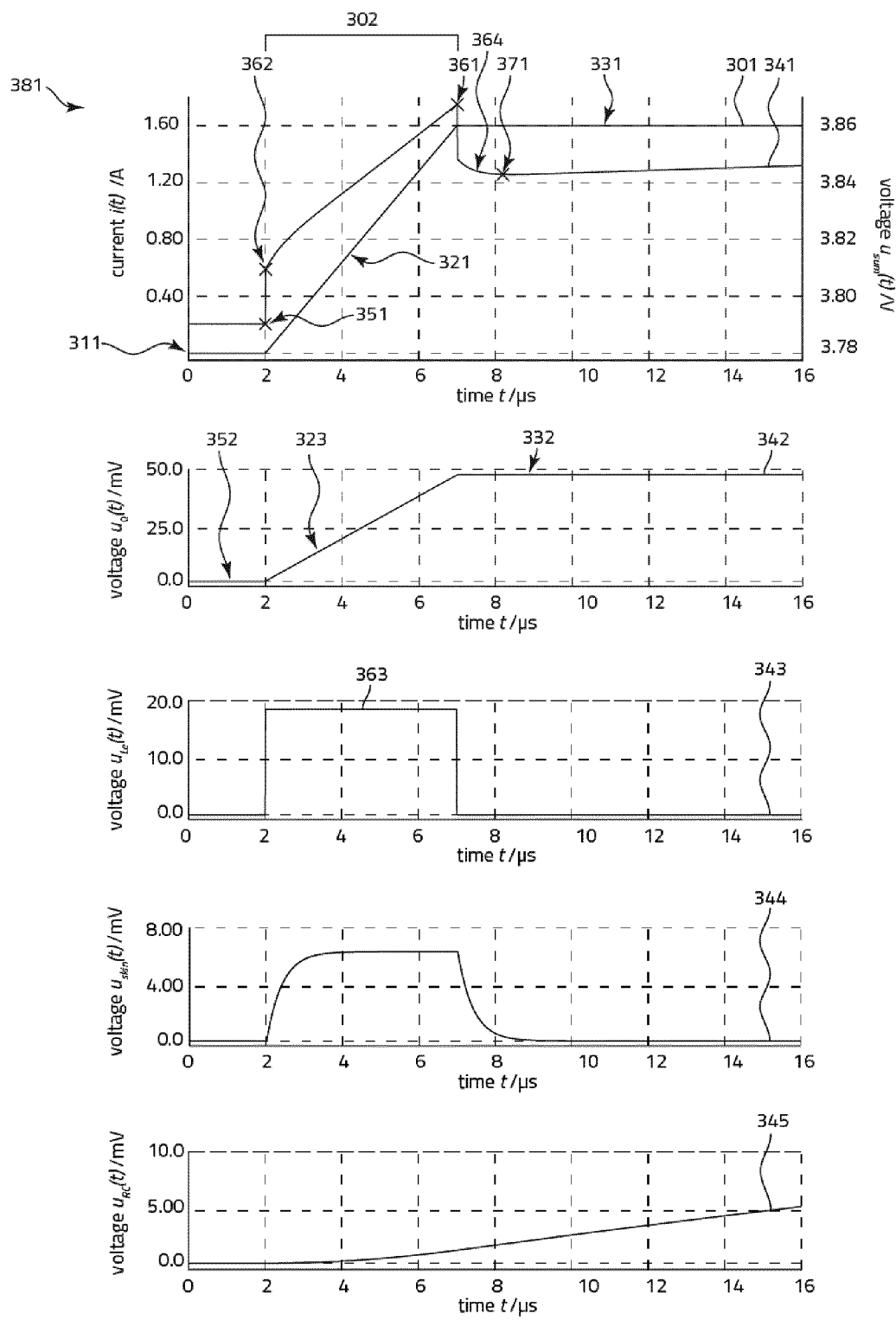
Figure 4:
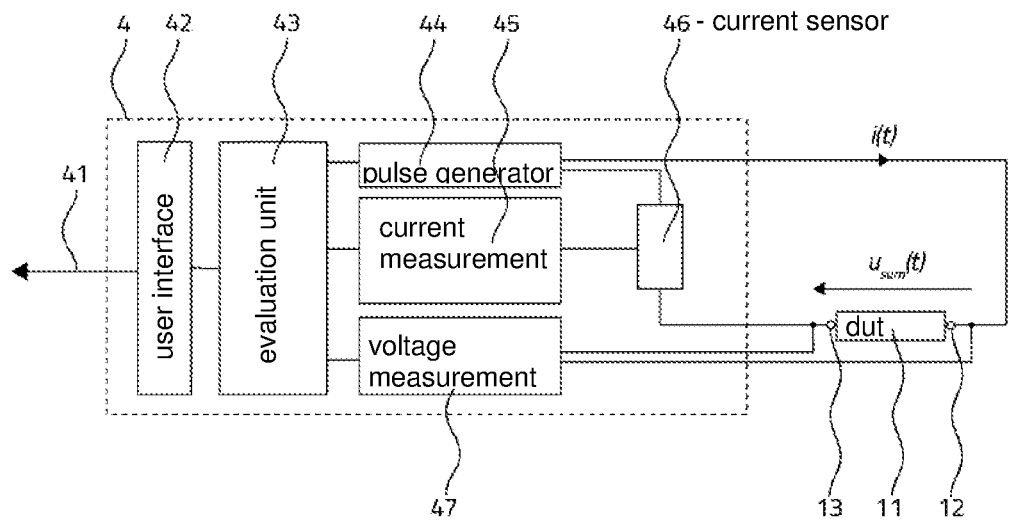
Figure 5:
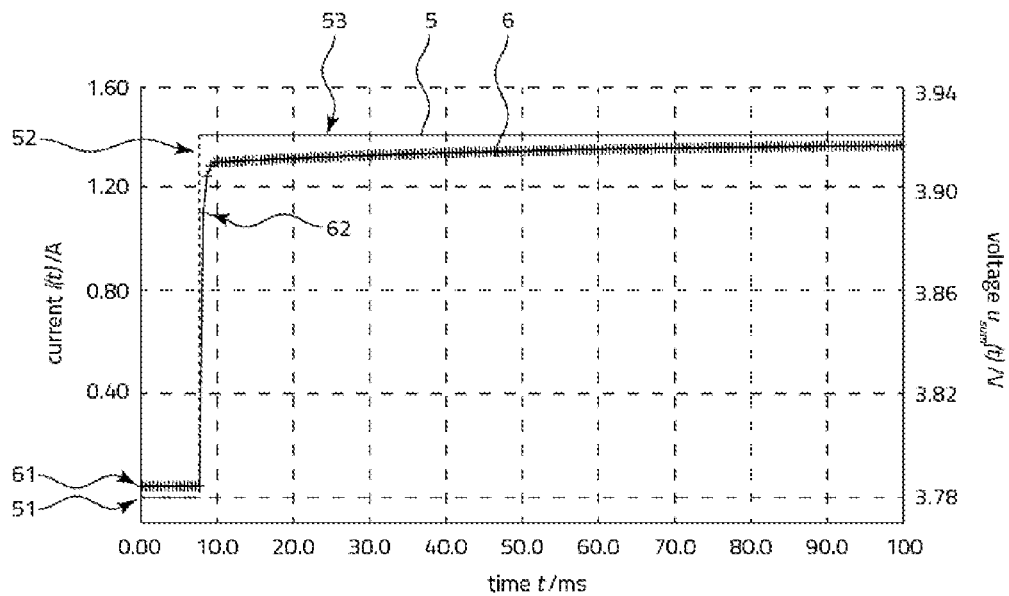

FIG. 1 an equivalent electric circuit (EEC) model that represents the electric behavior of a battery;

FIG. 2 a measured terminal voltage response $u_{sum}(t)$ of a lithium-ion battery over time;

FIG. 3 voltages of the single components of the EEC model;

FIG. 4 a schematic drawing of an apparatus for executing the method according to the invention; and FIG. 5 an applied current profile and the corresponding terminal voltage $u_{sum}(t)$ of a battery that is analyzed with an apparatus from the state of the art.

Analyzing impedances of an electrically conducting device with methods that are state of the art is either fast, precise or easily operable. None of the existing methods are able to meet these three attributes at the same time. Above all, the fast-dynamic impedances of a device under test 11 (e.g. c.f. FIG. 4), which represent the ohmic and inductive behavior, cannot be determined exactly with known methods and measurement devices.

FIG. 5 illustrates the current pulse method. In FIG. 5, the functional principle of the current pulse method is exemplified by results of a test performed with a lithium-ion battery cell. The current pulse i(t) 5 changes its value from an initial current $I_0$=0.00 A 51 to a constant current $I_2$=1.60 A 53. An apparatus that is able to apply such a current pulse i(t) 5 usually has a sample rate not better (slower) than 0.5 milliseconds. The single measurement points that were recorded in the example are marked by plus signs depicted in the profile of the terminal voltage response $u_{sum}(t)$ 6. Using conventional methods, the current change itself 52 is not exactly defined but usually shows a step with some transient oscillation caused by the current controller. These fast-dynamic control behavior and its effects on the voltage response $u_{sum}(t)$ are usually not detected since the first measurement point 62 is obtained 0.5 milliseconds after the start of the current pulse. Therefore, with conventional methods known from the state of the art, it is not possible to evaluate the fast-dynamic impedances of a device under test or to determine its ohmic and inductive impedances.

From an engineering perspective, the electric behavior of battery cells and systems, in particular, those based on the lithium-ion technology, can be modeled by an equivalent electric circuit (EEC) model 2, as shown in FIG. 1. Therein, the external inductance $L_e$ 21 is caused by electro-magnetic fields surrounding the current conductors and paths that run through a battery. So, the external inductance $L_e$ 21 provides information on the general integrity of a battery and on possible geometrical deformations, as caused by a mechanical impact. The RL element $R_{skin} \| L_i$ represents the internal inductance $L_i$ 23, which is caused by electromagnetic fields inside the current collectors, and the skin effect of the current collectors, which leads to an increased resistance $R_{skin}$ 24 when the current changes quickly. The ohmic resistance $R_\Omega$ 22 is one of the most important parameters to characterize a battery or technical component. In the exemplary case of lithium-ion batteries, it represents the limited electrical conductivity of the electrolyte, the electrode materials, the separator, the conductors, the welded joints, etc. Above all, a precise method and apparatus for analyzing impedances has to be able to precisely and analytically determine at least the ohmic resistance $R_\Omega$ 22 and preferably the external inductance $L_e$ 21 of a device under test 11 as well. None of the state-of-the-art methods and apparatus is able to determine these two highly important parameters.

The EEC model of a battery cell 2 comprises one or more RC elements, for example, to represent a double layer capacity $C_{RC}$ 25 in parallel to a charge transfer resistance $R_{RC}$ 26. Additionally, a complex impedance $\underline{Z}$ 27 and a voltage source $u_{eq}(C_{batt})$ 28 are comprised by the EEC model to represent mass transport phenomena and the equilibrium voltage depending on the residual capacity of a battery $C_{batt}$.

No matter what kind of device under test shall be analyzed, a connection between the testing apparatus and the device under test has to be established somehow. For this exemplary embodiment of the apparatus, of which the schematic layout is shown in FIG. 4, and for the present example of analyzing a lithium-ion battery the plus pole 12 and the minus pole 13 are used to induce the current pulse i(t) and measure the response of the terminal voltage $u_{sum}(t)$. Four-terminal sensing, also called Kelvin connection, is preferably used to connect the two terminals of the battery.

The objective of the present invention is to provide a tool for analyzing the impedances of batteries and other technical components that meets all three attributes: fast, precise and simple.

In FIG. 2, FIG. 3, and FIG. 4, an embodiment of the invention is presented for a lithium-ion battery cell. The example illustrates the operating principle of the method according to the invention and the general functionality of an apparatus based on this method.

An overview on the functional principle of the disclosed invention is given by FIG. 2. The shown current pulse i(t) 30 is generated and measured by an apparatus (4), which is configured to execute the method according to the invention. This current pulse i(t) 30 is applied to the terminals of a lithium-ion battery cell 12, 13. The measured terminal voltage of the battery cell 39 as well as the simulated voltage response $u_{sum}(t)$ 34, which is obtained from the EEC model 2 shown in FIG. 1, is depicted over the time t. The two voltage profiles, the measured one 39 and the simulated one 34, are almost equal and therefore validate the chosen EEC model 2.

In the present example, the current i(t) 30 changes from a constant current $I_0$=0 A 31 to a constant current $I_2$=1.60 A 33. The current change 32 itself is realized with a ramp that lasts for 5 μs and has a constant change rate di/dt=320 kA/s. As one of the basic characteristics of the disclosed invention, the current change 32 is quick enough to cause a defined inductive overshoot 36 in the voltage response $u_{sum}(t)$ 34, 39 that decays before possible other impedances with slower time constants significantly contribute to the total terminal voltage $u_{sum}(t)$ 34, 39. A local minimum $U_{sum,min}$ 37 occurs in the measured response of the terminal voltage $u_{sum}(t)$ 34, 39 after the inductive voltage overshoot 36 decayed and before impedances with slower time constants significantly contribute to the total terminal voltage $u_{sum}(t)$ 34, 39.

The characteristic voltage response $u_{sum}(t)$ 39 is measured with a sample rate that is high enough to detect at least the local minimum $U_{sum,min}$ 37. Then, the desired impedances can be determined by analyzing the relation between the applied current profile 30 and the measured terminal voltage response 39. A detailed view of the pulse is done by a zooming into the boxed area 38, 381 that is described in detail in FIG. 3.

FIG. 3 shows the functional principle of the method whereby a current pulse i(t) 301 is applied to the EEC model of a lithium-ion battery cell 2. The current profile i(t) 301 does not show any noise or oscillation in this example and is defined by an initial current $I_0$=0.00 A 311 that changes within 5 μs to a constant current $I_2$=1.60 A 331. The current change itself is done with a linear ramp 321 with a constant change rate di/dt=320 kA/s. The current pulse is similar to the measured current pulse shown in FIG. 2.

The terminal voltage response $u_{sum}(t)$ 341 of the EEC model is the sum of the voltage responses of the single EEC elements. The single voltage responses are shown separately in FIG. 3, wherein the voltage $u_\Omega(t)$ 342 is the contribution of the ohmic resistance $R_\Omega$ 22, the voltage $u_{Le}(t)$ 343 is caused by the external inductance $L_e$ 21, the voltage $u_{RL}(t)$ 344 is caused by the internal inductance $L_i$ 23 in parallel to the resistance for the skin effect $R_{skin}$ 24, and the voltage $u_{RC}(t)$ 345 is the contribution of the RC element 25, 26.

The voltage drop $u_\Omega(t)$ 342 over the ohmic resistance $R_\Omega$ 22 is directly proportional and instantaneous to the current profile. The voltage $u_{Le}(t)$ 343 at the external inductance $L_e$ 21 is 0 V for constant current phases 311, 331 and changes its value for time-variant currents. For the current ramp 321 the gradient di/dt is constant and thus the voltage at the external inductance $u_{Le}(t)$ 343 has a constant level $U_{Le}$ 363 during the rise time 321. The voltage contribution $u_{RL}(t)$ 344 caused by the RL element 23, 24 is zero when the current starts to change, reaches a maximum during the rise of the current, and vanishes in the subsequent constant current phase 331. Most other processes, as represented by the voltage $u_{RC}(t)$ 345 at the RC element 25, 26, usually have far slower time constants and do not significantly contribute to the total terminal voltage $u_{sum}(t)$ 341 at the beginning of the current profile i(t) 301.

Based on these findings and this knowledge, a method to analytically and uniquely determine the values of the ohmic resistance $R_\Omega$ 22 and the external inductance $L_e$ 21 is derived. This method can be implemented in an apparatus that applies the described current pulse i(t) 301 and measures the response in the overall terminal voltage $u_{sum}(t)$ 341.

The ohmic resistance $R_\Omega$ 22 is determined at the instant of time $t_3$ that is given by the local minimum, i.e. the second local opposite voltage extremum, $U_{sum,min}$ 371 in the terminal voltage response $u_{sum}(t)$ 341 after the current i(t) 301 reached its target value $I_2$ (i.e. the second level) 331 and the inductive overshoot (361) decayed. At this instant of time $t_3$, the overpotentials $u_{Le}(t)$ (343) of the external inductance $L_e$ (21) and $u_{RL}(t)$ (344) of the RL element (23, 24) vanished and voltages of slower dynamic processes, such as $u_{RC}(t)$ (345), do not yet significantly contribute to the terminal voltage $u_{sum}(t)$ (341). With the initial voltage $U_{sum,0}$ 351, the ohmic resistance $R_\Omega$ (22) can be calculated from the voltage difference $U_{sum,min}-U_{sum,0}$ and the current change $I_2-I_0$ to with:

$$R_\Omega=|(U_{sum,min}-U_{sum,0})/(I_2-I_0)|.$$

At the beginning of the current ramp at the instant of time $t_1$, the terminal voltage $u_{sum}(t)$ steps from $U_{sum,0}$ 351 to $U_{sum,1}$ 362. This step can be assigned to the external inductance $L_e$ 21, because the voltage contribution $u_\Omega(t)$ 342 of the ohmic resistance $R_\Omega$ 22, the voltage $u_{RL}(t)$ 344 of the RL element 23, 24, and the voltage $u_{RC}(t)$ 345 at the RC element 25, 26 do not significantly contribute to the terminal voltage $u_{sum}(t)$ 341 at the very beginning of the current ramp. With this step 362 in the terminal voltage response $u_{sum}(t)$ 341 and the linear current ramp 321 with a constant change rate di/dt, the external inductance $L_e$ 21 can be calculated:

$$L_e=|(U_{sum,1}-U_{sum,0})\cdot dt/di|.$$

When the initial terminal voltage $U_{sum,0}$ 351 and the voltage contributions $u_\Omega(t)$ 342 of the ohmic resistance $R_\Omega$ 22 and $u_{Le}(t)$ 343 at the external inductance $L_e$ 21 are subtracted from the terminal voltage response $u_{sum}(t)$ 341, only the voltage $u_{RL}(t)$ 344 of the RL element 23, 24 remains and the values of the internal inductance $L_i$ 23 and its parallel resistance $R_{skin}$ 24 can be determined.

A schematic overview of an embodiment of the apparatus according to the invention is shown in FIG. 4. The apparatus 4 comprises a user interface 42, which provides the measurement results and evaluated data 41 to the user. In one embodiment of the invention, the user is able to make individual settings via the user interface 42, as for example set the target value of the current $I_2$. The device under test 11 is placed on the right side of the apparatus 4 that is schematically shown in FIG. 4. The terminals 12, 13 of the device under test 11 are electrically connected to the apparatus 4 by a Kelvin connection. The first pair of lines connected to the terminals 12, 13 of the device under test 11 is used to induce the current pulse i(t) that is generated by the pulse generator 44 (i.e. current supply) of the apparatus 4. A current sensor 46 is integrated into the current path to allow a separate current measurement 45. The second pair of lines allows a precise measurement of the response of the terminal voltage $u_{sum}(t)$ by the voltage measurement unit 47 of the apparatus 4. The measured current i(t) and terminal voltage response $u_{sum}(t)$ is brought together and evaluated by the evaluation unit 43. This unit also implies the analytical determination of the ohmic resistance $R_\Omega$ 22 and the external inductance $L_e$ 21.

It is a major advantage of the invention to allow the unique and comprehensible determination of the ohmic resistance $R_\Omega$ 22 and the external inductance $L_e$ 21 by simple analytic equations. To determine these two impedances with conventional methods and apparatus is either not possible or requires elaborate fitting algorithms.

REFERENCE NUMERALS 11 device under test also referred to as electrically conducting device
12 first terminal of the device under test
13 second terminal of the device under test
2 EEC model of a battery
21 external inductance $L_e$
22 ohmic resistance $R_\Omega$
23 internal inductance $L_i$
24 skin effect resistance $R_{skin}$
25 capacitor of RC element $R_{RC}$
26 resistance of RC element $C_{RC}$
27 complex impedance $\underline{Z}$
28 equilibrium voltage $U_{eq}(C_{batt})$
30 measured current of a functional model of the apparatus
301 current profile
302 time interval
31, 311 constant initial current $I_0$, also referred to as first level
32, 321 current ramp from time instant $t_1$ to $t_2$
323 linear increase of $u_\Omega(t)$
33, 331 constant current $I_2$, also referred to as second level
332 voltage $u_\Omega(t)$ 342 of ohmic resistance $R_\Omega$ (22) for $I_2$ 331
34 simulated terminal voltage response $u_{sum}(t)$ for measured current pulse i(t) 30
341 simulated terminal voltage response $u_{sum}(t)$ for the current profile i(t) 301
342 voltage $u_\Omega(t)$ at ohmic resistance $R_\Omega$ 22
343 voltage $u_{Le}(t)$ at external inductance $L_e$ 21
344 voltage $u_{RL}(t)$ at RL element $R_{skin}\|L_i$ 23, 24
345 voltage drop $u_{RC}(t)$ of RC element $R_{RC}\|C_{RC}$ 25, 26
35, 351 initial terminal voltage $U_{sum,0}$ for $I_0$ 31, 311
352 initial voltage level of $u_\Omega(t)$ 342 for $I_0$ 311
36, 361 overshoot of terminal voltage $U_{sum,2}$ at time instant $t_2$
362 initial step in terminal voltage from $U_{sum,0}$ 351 to $U_{sum,1}$ at instant of time $t_1$
363 constant voltage $U_{Le}$ over external inductance $L_e$ 21 during current ramp 321
364 decay
37, 371 ohmic resistance voltage, second local extremum $U_{sum,min}$ of terminal voltage $u_{sum}(t)$ 341
38, 381 zoom for current ramp 32, 321
39 measured terminal voltage response $u_{sum}(t)$ for measured current pulse 30
4 schematic of one embodiment of the apparatus
41 flow of information to user
42 user interface
43 evaluation unit
44 pulse generator
45 current measurement
46 current sensor
47 voltage measurement
5 state-of-the-art current pulse i(t)
51 initial constant current value $I_0$
52 unknown change of current from $I_0$ 51 to $I_2$ 53
53 constant current value $I_2$
6 response of terminal voltage $u_{sum}(t)$ measured with state-of-the-art equipment
61 initial terminal voltage $U_{sum,0}$ for $I_0$ 51
62 first measurement point of terminal voltage response $u_{sum}(t)$ 6

The invention claimed is:

1. A method for determining an impedance of an electrically conducting device comprising:
applying a time-varying electric current to the electrically conducting device, wherein:
the current varies at least between a first level and a second level,
the current changes between the first level and second level within a time interval,
said time interval is so short that a voltage response of the electrically conducting device exhibits a first local voltage extremum followed by a decay, and
an ohmic resistance voltage is adopted by the voltage response, when the first local voltage extremum has decayed,
acquiring the voltage response at least partially, such that the acquired voltage response comprises and resolves the first volt local voltage extremum and the ohmic resistance voltage, wherein the sampling rate of the acquisition is selected such that at least two measurement points for the local voltage extremum are acquired, and
determining an impedance of the electrically conducting device from the acquired voltage response, particularly from the ohmic resistance voltage, and the applied current.

2. The method according to claim 1, wherein:
the first local voltage extremum is followed by a second opposite local voltage extremum or a voltage plateau, and
the ohmic resistance voltage is the voltage at the second opposite local voltage extremum, particularly wherein the second opposite local voltage extremum is spaced apart closer than 0.5 milliseconds, particularly closer than 100 microseconds, more particularly closer than 10 microseconds, particularly closer than 5 microseconds from the first local extremum.

3. The method according to claim 1, wherein the time interval is less than 0.5 milliseconds, particularly less than 0.1 milliseconds, more particularly less than 50 microseconds, even more particularly less than 10 microseconds, particularly 5 microseconds.

4. The method according to claim 1, wherein the electrically conducting device is:
a battery,
a battery pack,
a battery bank, or
a system of batteries.

5. The method according to claim 1, wherein the electrically conducting device's voltage response is modelled as an equivalent electric circuit comprising at least one inductive element, at least one ohmic resistance element, an RC-element and particularly an RL element, wherein the elements are particularly connected in series.

6. The method according to claim 1, wherein:
an ohmic resistance $R_\Omega$ of the impedance of the electrically conducting device is determined, wherein the ohmic resistance is particularly determined from $R_\Omega = |(U_{sum,min} - U_{sum,0})/(I_2 - I_0)|$, and
$I_0$ is the first level, $I_2$ is the second level, $U_{sum,min}$ is the ohmic resistance voltage, of the voltage response and $U_{sum,0}$ is the voltage of the voltage response, when the current is at the first level.

7. The method according to claim 1, wherein:
the voltage response comprises an inductive voltage response $U_{sum,1}$,
the inductive voltage response $U_{sum,1}$ is determined from the voltage response that is acquired at the instant the applied current starts changing from the first level to the second level, and
the inductive voltage response $U_{sum,1}$ is particularly an initial voltage step exhibited by the voltage response at said instant.

8. The method according to claim 1, wherein the applied current changes from the first level with a constant rate di/dt, wherein the rate is particularly higher than 1 kA/s.

9. The method according to claim 7, wherein an external inductance of the electrically conducting device is determined from $L_e = |(U_{sum,1} - U_{sum,0}) \cdot dt/di|$, wherein $U_{sum,1}$ is the inductive voltage response, and Le is the external inductance of the electrically conducting device.

10. The method according to claim 1, wherein the applied current is changing from a constant first level to a constant second level.

11. The method according to claim 1, wherein the first level or the second level is 0 Ampere and particularly wherein the modulus of the other level, the second or the first level, is greater than 0.01 Ampere.

12. The method according to claim 1, wherein the applied current alternates repeatedly between the first level and the second level and particularly wherein the applied current changes between the first level and the second level within different time intervals and/or at variable rates 321), wherein particularly the second level is different particularly with each repetition.

13. The method according to claim 1, wherein:
the impedance of the electrically conducting device is determined by a model-function that is fitted to the acquired voltage response,
the model-function comprises a term that accounts for a voltage response caused by at least one inductive element and a term accounting for a voltage response caused by at least one ohmic resistance element, particularly wherein the model-function is configured to model the equivalent electric circuit, wherein particularly the model function comprises fit parameters, and from the fitted model function, the fit parameters are determined and from the fit parameters at least the ohmic resistance, particularly the impedance of the electrically conducting device is determined.

14. A computer program for determining an impedance of an electrically conducting device comprising computer program code, wherein, when the computer program is executed on a computer, the method according to claim 1 is executed.

15. An apparatus for executing the method according to claim 1, wherein the apparatus comprises a current supply and wherein the apparatus is configured to acquire the voltage response with a temporal resolution that is sufficiently high to determine the first local voltage extremum and particularly the second local opposite voltage extremum of the voltage response, wherein the apparatus particularly has a temporal resolution for recording the voltage response of at least 10 microseconds.

16. The method according to claim 2, wherein the electrically conducting device is:
a battery,
a battery pack,
a battery bank, or
a system of batteries.

17. The method according to claim 2, wherein the electrically conducting device's voltage response is modelled as an equivalent electric circuit comprising at least one inductive element, at least one ohmic resistance element, an RC-element and particularly an RL element, wherein the elements are particularly connected in series.

18. The method according to claim 2, wherein the time interval is less than 0.5 milliseconds, particularly less than 0.1 milliseconds, more particularly less than 50 microseconds, even more particularly less than 10 microseconds, particularly 5 microseconds.

19. The method according to claim 18, wherein the electrically conducting device is:
a battery,
a battery pack,
a battery bank, or
a system of batteries.

20. The method according to claim 18, wherein the electrically conducting device's voltage response is modelled as an equivalent electric circuit comprising at least one inductive element, at least one ohmic resistance element, an RC-element and particularly an RL element, wherein the elements are particularly connected in series.

21. The method according to claim 1, wherein a temporal resolution of the acquired voltage response is better than 10 microseconds.

* * * * *